United States Patent [19]

Zahn et al.

[11] 4,176,448

[45] Dec. 4, 1979

[54] AUTOPIN MACHINE

[75] Inventors: Irwin Zahn, New York, N.Y.; Heinrich F. Meyer, Ormond Beach, Fla.

[73] Assignee: General Staple Company, Inc., New York, N.Y.

[21] Appl. No.: 942,332

[22] Filed: Sep. 14, 1978

Related U.S. Application Data

[62] Division of Ser. No. 773,274, Mar. 1, 1977, abandoned.

[51] Int. Cl.² .............................................. H05K 3/30
[52] U.S. Cl. ................................... 29/626; 29/564.6; 29/739; 227/120
[58] Field of Search ............ 29/33 K, 337, 626, 56.6, 29/564.6, 739, 741, 798; 227/93, 97, 98, 120

[56] References Cited

U.S. PATENT DOCUMENTS

| | | | |
|---|---|---|---|
| 3,257,708 | 6/1966 | Stricker | 29/626 X |
| 3,362,602 | 1/1966 | Anstett | 227/120 X |
| 3,616,534 | 11/1971 | Black | 29/626 |
| 3,975,811 | 8/1976 | Meyer | 29/798 X |

Primary Examiner—Z. R. Bilinsky
Attorney, Agent, or Firm—Lerner, David, Littenberg & Samuel

[57] ABSTRACT

An apparatus and supply strip is disclosed for inserting terminal pins into an apertured workpiece. The apparatus includes reciprocating feeding means for sequentially advancing a supply strip of integrally connected preformed terminal pins toward the workpiece; shearing means for severing the leading one of said pins from the remainder of the supply strip; and driving means for inserting the severed lead one of said pins into the workpiece. The feeding means comprises grasping means operable only when the feeding means is moving in a first direction toward the workpiece to grasp the supply strip at the juncture of adjacent integrally connected preformed terminal pins.

2 Claims, 8 Drawing Figures

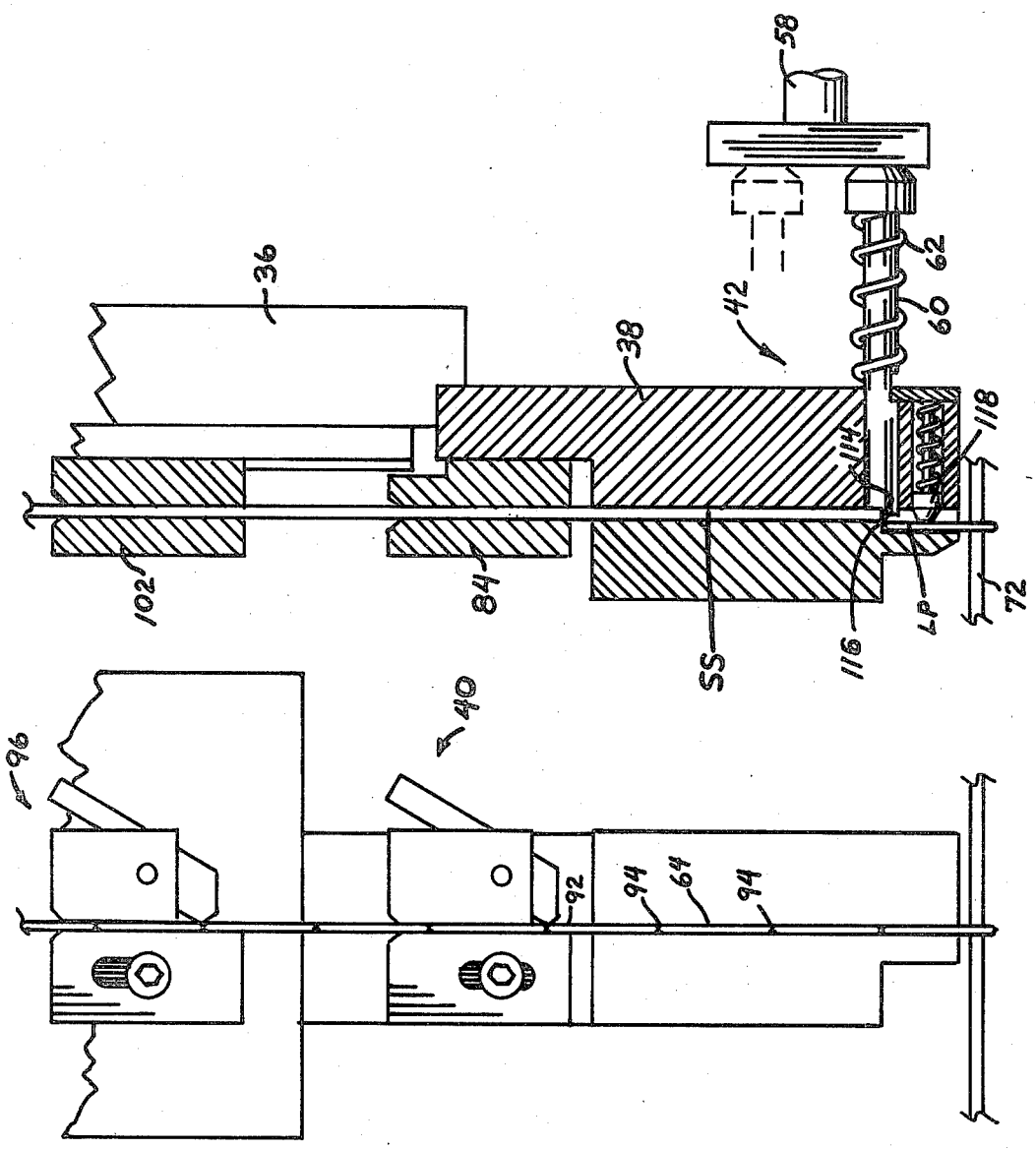
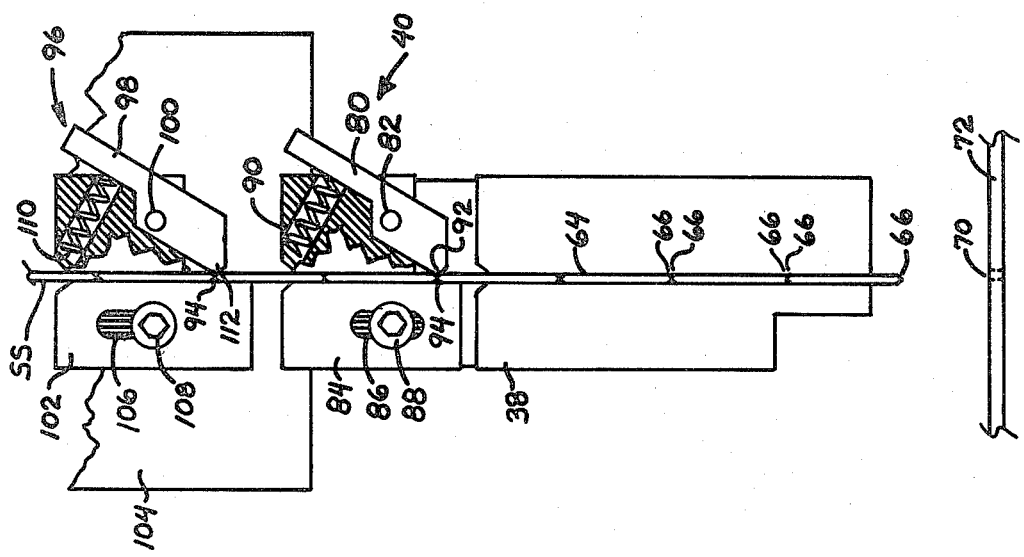

AUTOPIN MACHINE

This is a division, of application Ser. No. 773,274, filed Mar. 1, 1977, now abandoned.

FIELD OF THE INVENTION

This invention relates to an apparatus and supply strip for inserting elements such as electrical metal pins into an apertured workpiece such as a printed circuitboard and more particularly relates to such an apparatus which operates from a continuous supply strip of integrally connected preformed terminal pins which when inserted in the workpiece will leave exposed a pointed end portion.

BACKGROUND OF THE INVENTION

In the fabrication of many electrical products it is frequently necessary to establish a plurality of upstanding terminal pins on a substrate. For example, on printed circuitboards, it is necessary to establish terminal points to which external wiring can be secured. Various types of apparatus are known which operate from a continuous supply strip to intermittently feed, sever and drive terminal pins into a workpiece. However, all such known prior art apparatus and terminal pins inserted thereby suffer from the disadvantage that the terminal pins formed and inserted in the substrate terminate in end portions which have the same planar cross-sectional area as the supply stock from which the terminal pins were formed.

Such blunt end portions of the terminal pins formed and inserted by apparatus of the prior art are particularly undesirable especially in the environment in which a wire wrap operation is to be applied for electrically connecting an external wire to the terminal pin. In fact, many OEM manufacturers who have to employ wire wrapping techniques to electrically connect to printed circuitboards will refuse to accept terminal pins in such boards where the terminals terminate in blunt end portions of the same planar cross-section as the pin itself. Apparently, the blunt nature of the terminal pins make it difficult to center the wire wrapping operation which is to take place for establishing electrical connection to the printed circuits.

Another problem associated with the prior art apparatus for forming and inserting terminal pins in printed circuitboards, and somewhat related to the fact that the end portions of the inserted pins are of the same planar cross-section as the remainder of the pins, is the fact that during the shearing operation necessary to form the individual pins, an undesirable burr remains on the sheared pins. The thicker the cross-section of the supply stock, the more difficult it is to effect a shearing operation and the more pronounced is the undesirable burr which results.

SUMMARY OF THE INVENTION

The instant invention provides an apparatus and supply strip for inserting terminals into a substrate or workpiece such as a printed circuitboard but which eliminates the aforedescribed problems inherent in the prior art machines and methods. More particularly, the novel supply strip of the instant invention comprises a plurality of integrally connected preformed terminal pins each of which terminate in pointed end portions, whereby integrally connected against pointed end portions of adjacent pins form notch regions in the supply strip which notched regions are advantageously employed in the novel apparatus hereof to sever and insert terminal pins in a workpiece such as a printed circuitboard in such a fashion that the pointed end portions of each terminal pin end up being exposed to facilitate connection thereto.

In one embodiment of the novel supply strip hereof, the cross-section of the preformed integrally connected pins is rectangular in configuration whereby the pointed end portions are prismatic in nature. In such embodiment, the maximum chordal dimension from opposing corners of the rectangular cross-section of the pin is greater than the diameter of the apertures into which the pins are inserted whereby a tight press fit is possible.

In another embodiment of the invention, the terminal pins are of circular cross-section whereby the pointed end portions are of generally frustoconical configuration. In such an embodiment, a region of the length of each pin is enlarged as by a swaging operation so as to make a press-fit possible even though the normal cross-section of the terminal pins is less than the diamaeter of the aperture into which the pins are being inserted.

The novel apparatus hereof includes feeding means comprising grasping means operable only when the feeding means is moving in the first direction of travel toward the workpiece to grasp and advance the supply strip at the juncture of adjacent integrally connected preformed terminal pins. On the return upward stroke, the grasping means are free to slide relative to the supply strip which is at that point held stationary by an antireverse checking cam which also coacts with the notched regions in the supply strip formed by the integrally connected preformed terminal pins.

In accordance with a feature of the invention, the feeding means is adjustable relative to the shearing means so that the length therebetween can be varied to accept preformed terminal pins of varying lengths.

In accordance with a further feature of the instant invention, a tandum arrangement may be employed in which the duplicate feeding means each may be adjusted independently relative to their respective shearing means such that the same apparatus will be capable of multiple injection of terminal pins of different lengths.

As a further feature of the invention, the shearing means is operable, during shearing of the leading one of the terminal pins, to displace the severed leading pin to a position under the driving means whereby positive driving action is assured. Furthermore, during such driving action, the severed pin is maintained in its desired position by a spring-biased keeper arrangement.

Accordingly, it is an object of the instant invention to provide apparatus and a supply strip therefor which will insert terminal pins into a workpiece such as a printed circuitboard in such a manner as to leave pointed exposed portions of the terminal pins available for electrical connection thereto.

Another object of the instant invention is to provide such an apparatus and supply strip which is capable of producing and inserting terminal pins of varyi lengths.

Yet another object of the instant invention is to provide such an apparatus and supply strips therefor which is capable of simultaneously inserting a plurality of terminal pins and even a plurality of such terminal pins of differing lengths.

Still another object of the instant invention is to provide such an apparatus and supply strip for inserting pointed terminal pins which may employ either circular, rectangular or square configuration.

Still another object of the instant invention is to provide such an apparatus and supply strip which eliminates the burring problem inherent in prior art machines for inserting terminal pins in printed circuitboards.

These and other objects of the instant invention will be further understood by referring to the specification and the following drawings.

BRIEF DESCRIPTION OF THE SEVERAL VIEWS OF THE DRAWINGS

FIG. 2 is an enlarged front elevation of a portion of the machine of the instant invention and illustrating the manner in which the feeding mechanism thereof coacts with the novel supply strip of the instant invention.

FIG. 3 is a view similar to FIG. 2 but illustrating the operation of the machine at a different portion in its cycle of operation.

FIG. 4 is a side view, in section, of the portion of the apparatus shown in FIG. 3.

DETAILED DESCRIPTION

Figure 1:
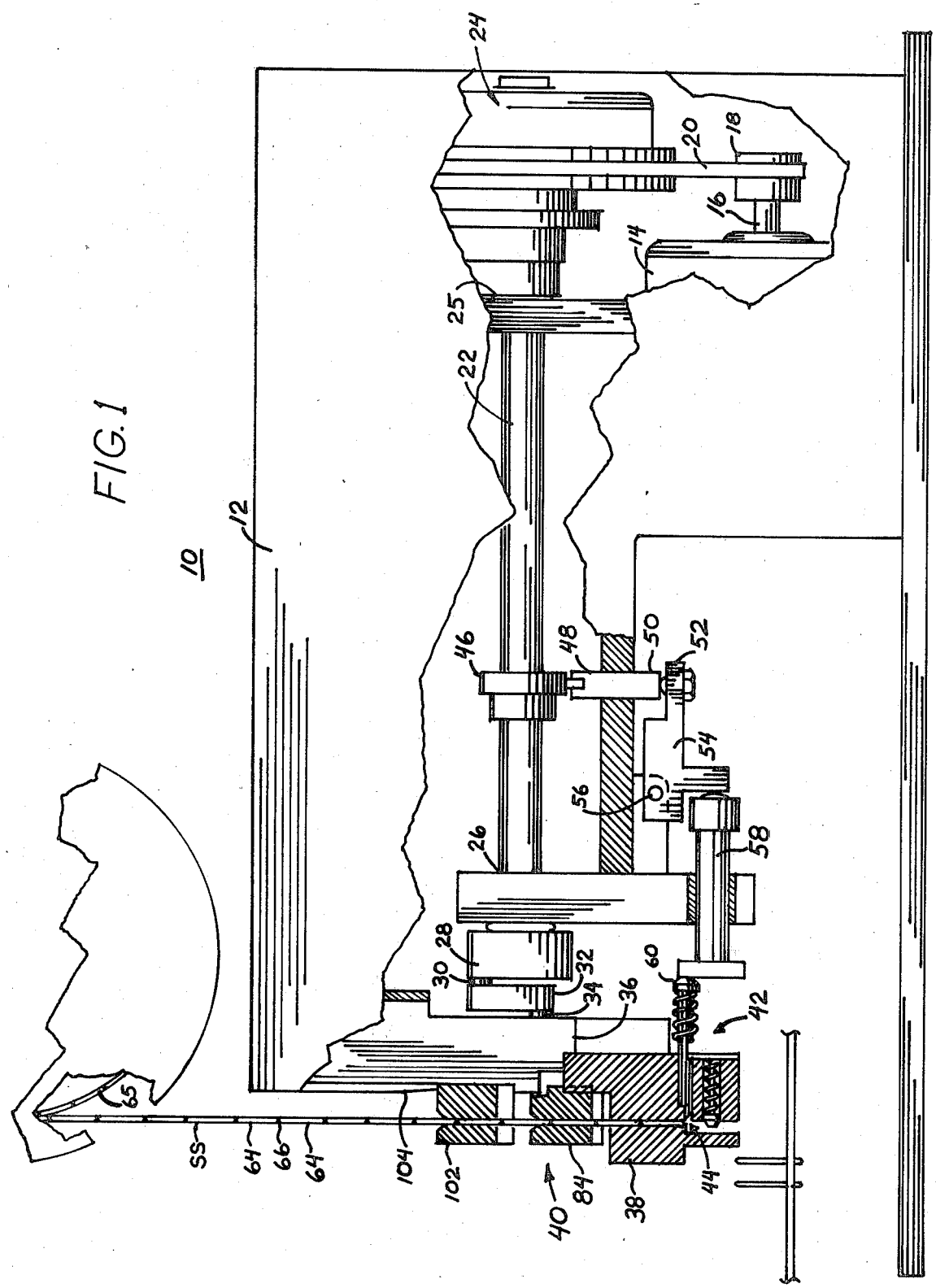
FIG. 1 is a side elevational view of the machine of the instant invention which also illustrates the novel supply strip of the instant invention.

Turning to the drawings, wherein like numerals are used to designate like elements, the machine 10 of the instant invention is seen to include a frame generally indicated 12 within which is located motor 14. The output shaft 16 carries pulley 18, the rotation of which is communicated by V-belt 20 to main shaft 22 through the intermediate and selective operation of a conventional solenoid actuated, single revolution clutch, broadly designated 24. Main shaft 22 is journalled for rotation in bearings 25 and 26 carried on the main frame 12. At the leftmost end of shaft 22 there is carried a crank 28 having an upstanding pin 30 thereon. A link 32 is connected between pin 30 and a pin 34 carried on the rear of a longitudinally reciprocating slide member 36. Secured to the slide member 36 and movable therewith is a block 38 which carries the feed mechanism broadly designated 40, the shearing mechanism broadly designated 42, and the driving mechanism broadly designated 44, the details of all of which will be presented in greater detail.

Keyed for rotation with main shaft 22 is an eccentric cam 46, the cam surface of which controls the downward stroke of a follower 48, the lower end 50 of which projects through the frame 12 and is engaged with the rightmost end 52 of a bell crank lever 54 pivoted to the frame at 56. The belt crank lever 54 is normally biased counterclockwise around its pivot point 56. However, when the follower 48 is depressed by the eccentric cam 46, the bell crank lever 54 rotates clockwise to drive the cutter actuator plunger 58 to the left as viewed in FIG. 1, to actuate the shearing plunger 60 to sever the leading terminal pin LP (see FIG. 4) from the remaining supply strip SS (FIG. 4) of terminal pins. A compression spring 62 normally maintains the shearing plunger 60 in its rightmost, non-shearing position.

As can be seen in the Figures, the supply strip SS is in the form of a continuous length of electrically conductive material formed of integrally connected preformed terminal pins 64, the supply strip being stored in coil form, shown at 65 in FIG. 1, and sequentially advanced by the reciprocating feeding means 40 in a manner as described with respect to FIGS. 2–4. As seen in the Figures, each of the integrally connected terminal pins 64 terminate in pointed end portions 66; integrally connected adjacent pointed end portions 66 of adjacent pins 64 forming notched regions in the supply strip SS.

Figure 6:
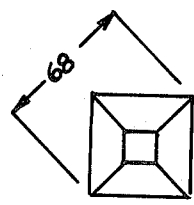
FIG. 6 is a top view of one embodiment of a terminal pin constructed in accordance with the teachings of the instant invention.

In one embodiment of the instant invention, the terminal pins 64 are of rectangular or square cross-section such that the pointed end portions are of prismatic configuration, as illustrated in FIG. 6. In the embodiment wherein the cross-section of the terminal pins is square or rectangular, the maximum dimension illustrated at 68 in FIG. 6, is greater than the diameter of the aperture 70 (FIG. 2) in the workpiece 72 into which the pins 64 are to be inserted whereby a tight-press fit can be obtained.

Figure 7:
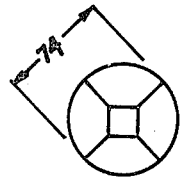
FIG. 7 is a top view of an alternative embodiment of a terminal pin constructed in accordance with the teachings of the instant invention.
Figure 8:
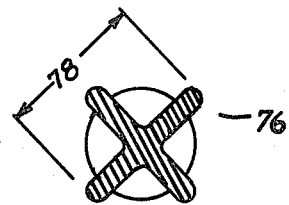
FIG. 8 is a cross-sectional view taken along the center of a terminal pin constructed in accordance with yet a further embodiment of the instant invention.

In an alternative embodiment of the instant invention, the supply strip is formed of integrally connected preformed terminal pins of circular cross-section such that the pointed end portions are of frustoconical configuration, as illustrated in FIG. 7. In this embodiment, the diameter of the terminal pins, indicated as 74 in FIG. 7, is less than the diameter of the aperture 70 in the workpiece 72 into which the pin is to be inserted. Therefore, with this embodiment a region along the length of each of the terminal pins is enlarged, as illustrated at 76 in FIG. 8, whereby the enlarged region will have a dimension 78 larger than the diameter of the aperture 70 in the workpiece 72 into which the pin will be inserted.

In the preferred method of manufacture of the supply strip of the present invention a continuous ribbon of electrically conductive material (of rectangular, square, or circular cross-section) is passed through notching dies of appropriate configuration which intermittently operate to notch the stock material so as to form the pointed end portions on adjacent terminal pins integrally connected to one another. In the case of stock material of circular configuration, an additional swaging step is performed on each terminal pin to form the enlarged region, illustrated at 76 in FIG. 8.

Turning to FIG. 2, it will be seen that the feeding means 40 includes grasping means in the form of a pivoting feed finger 80 pivoted for rotation about a pivot pin 82 carried by a guide block 84. Guide block 84 is slotted, as at 86, and connected to block 38 by screw 88 whereupon by loosening screw 88 the position of guide block 84, and hence the position of feed finger 80, may be varied along the length of block 38.

Feed finger 80 is normally biased by a small compression spring 90 to rotate in a clockwise direction around its axis 82. The end 92 of feed finger 80 is so configured as to enter the notched regions 94 formed between adjacent pointed end portions 66 of adjacent terminal pins 64. Thus when slide member 36 and block 38 are reciprocated in a downward direction, as viewed in FIG. 1 and FIG. 2, the end portion 92 of feed finger 80

(being biased into the notched region 94) causes the supply strip SS to be advanced toward the workpiece 72. On the return upward stroke, the feed finger 80 slides freely along the now stationary supply strip SS held in a stationary position by an anti-reverse motion camming means, broadly designated 96 in FIG. 2.

Anti-reverse motion camming means 96 includes a check-finger 98 mounted for pivotal rotation on pivot pin 100, carried by another guide block 102 fixed to the front face 104 of the frame 12. The second guide block 102 likewise includes an elongated slot 106 through which a screw 108 passes in securing the guide block 102 to the front face 104. Thus by loosening screw 108, the guide block 102 and hence the check-finger 98 may be adjusted along the length of the face 104. Check-finger 98 is biased in a clockwise direction by a small compression spring 110 housed in the guide block 102. The pointed end 112 of check-finger 98 engages the notched regions 94 to prevent the supply strip from moving upwardly back toward the supply coil 65 when the block 38 and the feed finger 80 are reciprocating in their upward path of travel.

The timing of the machine, prearranged by the eccentric cam 46, is such that when the downwardly travelling feeding finger 80 has advanced the supply strip the length of one terminal pin 64, the cutter plunger 60 will be actuated toward the left, as viewed in FIG. 4 (by the previously described action of the bell crank lever 54) to cause the shearing edge 114 to sever the leading pin LP from the remaining supply strip SS. During the shearing operation the leading pin LP is displaced laterally to the left, as viewed in FIG. 4, so as to be placed under the driving shoulder 116 which then continues to drive the pin into the workpiece 72. During the remainder of the downward travel, the leading pin LP is maintained in its proper position under the driving shoulder 116 by a spring-biased keeper plunger designated 118 carried in the block 38 beneath the cutting plunger 60.

As will be appreciated from the above description, certain spatial relationships must be maintained between the various described elements. For example, the distance between the end 92 of the feeding finger 80 and the shearing edge 114 must be either the exact length of one of the terminal pins 64 or a multiple thereof. Only in this manner will it be assured that the shearing edge severs the leading pin LP from the supply strip SS at the juncture of the integrally connected pointed end portions 66 of adjacent pins 64 forming the notched regions 94 in the supply strip. This is extremely critical since it guarantees that the end portion of the finally inserted pin will indeed have the pointed end portion which is highly desirable in situations where a wire wrap application is to be applied. Likewise, by severing at the mid-point of the notched regions 94, the sharpest pointed end portion on the terminal pin is formed thereby eliminating any possibility of an undesirable burr remaining.

It will be appreciated that supply strips formed of integrally connected preformed terminal pins of a different length may be employed simply by adjusting the position of guide block 84 to always make sure that the distance between the driving edge 92 of the feed finger 80 and the shearing edge 114 of the shearing plunger 60 is a multiple of the length of the pins 64. Similarly, when the pins 64 are of a different length, the spacing of the guide block 102 will also be changed relative to the spacing of the guide block 84 so that the distance between the end 112 of the check-finger 98 and the end 92 of the feed finger 80 will be a multiple of the length of the terminal pins 64.

Figure 5:
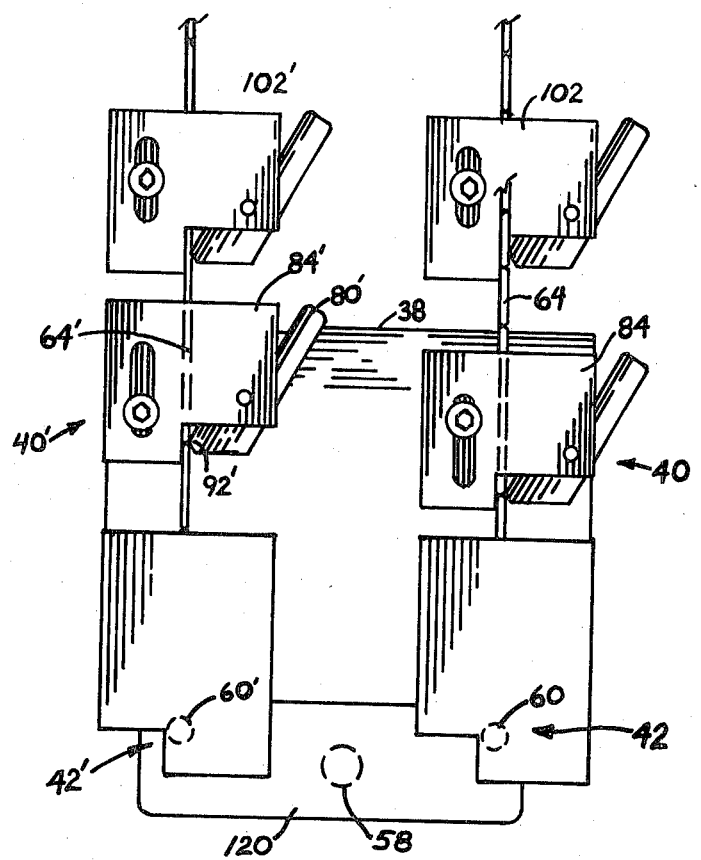
FIG. 5 is a front elevation of a portion of an alternative embodiment of the apparatus of the instant invention in which tandem operation is disclosed as well as an embodiment in which terminal pins of differing lengths are inserted in a printed circuitboard by the same apparatus.

Turning to FIG. 5, there is illustrated in somewhat schematic form an alternative embodiment of the instant invention by which two terminal pins may be simultaneously inserted into a workpiece such as a printed circuitboard. In such an embodiment, a duplicate set of tooling is employed, i.e., guide block 102' is also fixed to the front face 102; duplicate feeding means 40' is carried by an enlarged block 38; and duplicate shearing means 42' is likewise carried by guide block 38. Slide member 36 drives block 38 in the manner previously described and an enlarged bar 120 is carried on the face of the cutter actuator plunger 58 to actuate the shearing plunger 60 and 60' associated with each of the shearing mechanisms 40 and 42'.

FIG. 5 also illustrates the manner in which the tandem arrangement shown therein may be employed to simultaneously insert terminal pins which are of a different length. For example, it will be seen that the terminal pins 64' are substantially longer than the terminal pins 64 being processed by the tooling shown on the right-hand side of the apparatus of FIG. 5. However, and as described previously, this greater length may be easily accommodated simply by raising the guide block 84' to make sure that the distance between the end 92' of the feed finger 80' remains either the same length as, or a multiple of, the length of the terminal pins 64'.

While the invention has been described with a certain degree of particularity, it will be understood that the description was by way of example only and that numerous variations and modifications, as may become apparent to those of ordinary skill in the art, can be made without departing from the spirit and the scope of the invention as hereinafter claimed.

We claim:

1. A method for inserting terminal pins into a workpiece; said method comprising:
   providing a supply strip of integrally connected preformed terminal pins connected in longitudinally extending end-to-end relationship; wherein said preformed terminal pins terminate in pointed end portions, integrally connected adjacent pointed end portions of adjacent pins forming notched regions in said supply strip;
   sequentially advancing said supply strip toward said workpiece;
   shearing the leading one of said terminal pins from the remainder of said supply strip at said notched regions;
   driving said leading one of said pins into said workpiece; and
   further including the step of holding said leading one of said terminal pins by a holding means after it has been sheared and continuing to hold said pin by said holding means while it is being driven into said workpiece.

2. The method of claim 1, wherein the step of sequentially advancing said supply strip includes: the step of grasping said supply strip at said notched regions.

* * * * *